(12) United States Patent
Zeller

(10) Patent No.: US 10,782,377 B2
(45) Date of Patent: Sep. 22, 2020

(54) MAGNETIC RESONANCE METHOD AND APPARATUS FOR GENERATING DIFFUSION-WEIGHTED IMAGE DATA

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 67 days.

(21) Appl. No.: 16/180,145

(22) Filed: Nov. 5, 2018

(65) Prior Publication Data

US 2019/0137591 A1 May 9, 2019

(30) Foreign Application Priority Data

Nov. 6, 2017 (DE) .................. 10 2017 219 682

(51) Int. Cl.
*G01R 33/563* (2006.01)
*G01R 33/565* (2006.01)
*G01R 33/561* (2006.01)
*G01R 33/48* (2006.01)

(52) U.S. Cl.
CPC ..... *G01R 33/56341* (2013.01); *G01R 33/482* (2013.01); *G01R 33/5611* (2013.01); *G01R 33/56518* (2013.01); *G01R 33/56554* (2013.01); *G01R 33/5616* (2013.01)

(58) Field of Classification Search
None
See application file for complete search history.

(56) References Cited

U.S. PATENT DOCUMENTS

| | | | | |
|---|---|---|---|---|
| 9,095,302 B2* | 8/2015 | Porter | ............. | G01R 33/56341 |
| 10,261,156 B2* | 4/2019 | de Oliveira | ........ | G01R 33/4818 |
| 10,495,714 B2* | 12/2019 | Feiweier | .......... | G01R 33/56341 |
| 10,502,801 B2* | 12/2019 | Zeller | ................ | G01R 33/5611 |
| 2010/0237864 A1 | 9/2010 | Stemmer | | |
| 2013/0033262 A1* | 2/2013 | Porter | ................ | G01R 33/5676 |
| | | | | 324/309 |

(Continued)

FOREIGN PATENT DOCUMENTS

WO WO-2015/184226 A1 12/2015

OTHER PUBLICATIONS

Zeller, et al. "Phase?labeled reference EPI for frequency?segmented inhomogeneity corrections (PREFICS)," Magnetic Resonance in Medicine, vol. 71, pp. 1117-1122 (2014).

(Continued)

*Primary Examiner* — Jermele M Hollington
(74) *Attorney, Agent, or Firm* — Schiff Hardin LLP

(57) ABSTRACT

In a magnetic resonance method and apparatus for generating diffusion-weighted image data, at least two recordings are implemented in which raw data are acquired at raw data points of a raw data memory weighted with a b-value. The raw data memory has a first subregion and a second subregion, the first subregion being more than half of the total raw data points of the raw data memory. In each of the at least two recordings of the first subregion, full sampling takes place, and the second subregion is differently undersampled in the respective recordings. The raw data are combined and reconstructed into image data weighted with the b-value.

12 Claims, 8 Drawing Sheets

(56) References Cited

U.S. PATENT DOCUMENTS

| | | | |
|---|---|---|---|
| 2016/0202338 A1* | 7/2016 | Kimura | G01R 33/56341 |
| | | | 324/309 |
| 2017/0205486 A1* | 7/2017 | Zeller | G01R 33/50 |
| 2017/0212199 A1* | 7/2017 | Itriago Leon | G01R 33/4835 |
| 2017/0234956 A1* | 8/2017 | Feiweier | G01R 33/56341 |
| | | | 324/309 |

OTHER PUBLICATIONS

Zeller, et al. "Boosting BOLD fMRI by K-Space Density Weighted Echo Planar Imaging" Plos One, vol. 8, No. 9, 04501; (2013).

Chen, et al.: "Improved Image Reconstruction for Partial Fourier Gradient-Echo Echo-Planar Imaging (EPI)" Magnetic Resonance in Medicine, vol. 59, No. 4, pp. 916-924; (2008).

Chang, et al. "Interleaved Diffusion-Weighted EPI Improved by Adaptive Partial-Fourier and Multiband Multiplexed Sensitivity-Encoding Reconstruction" Magnetic Resonance in Medicine, vol. 73, pp. 1872-1884, (2015).

PractiCal fMRI: the nuts & bolts "Physics for understanding fMRI artifacts: Part Fourteen"—Partial Fourier EPI; practicalfmri.blogspot.de/2013/06/physics-for-understanding-fmri (2013).

Shapiro, Erik M. et al. "Fast MRI of RF Heating Via Phase Difference Mapping" Magnetic Resonance in Medicine, vol. 47, No. 3, pp. 492-498, Mar. 2002 (first published: Feb. 20, 2002) // https://doi.org/10.1002/mrm.10067.

German Action dated Mar. 22, 2020, for Application No. 102017219682.3.

* cited by examiner

MAGNETIC RESONANCE METHOD AND APPARATUS FOR GENERATING DIFFUSION-WEIGHTED IMAGE DATA

BACKGROUND OF THE INVENTION

Field of the Invention

The present invention concerns a method for operating a magnetic resonance (MR) apparatus in order to produce diffusion-weighted image data. The invention also concerns an MR apparatus, and an electronically readable data storage medium encoded with programming instructions, for implementing such a method.

Description of the Prior Art

In a magnetic resonance apparatus, an examination object, particularly a patient, is exposed to a relatively strong main magnetic field of, for example, 1.5 or 3 or 7 tesla, with the use of a basic field magnet. In addition, gradient pulses are applied by a gradient coil arrangement. By with a radio-frequency (RF) antenna system that includes suitable antennas, RF pulses, for example excitation pulses, are emitted, which cause the nuclear spins of particular atoms excited into resonance by the RF pulses are deflected through a defined flip angle relative to the magnetic field lines of the basic magnetic field. During relaxation of these excited nuclear spins, RF signals known as magnetic resonance signals (MR signals) are emitted, and are received by suitable RF antennae, and then further processed. From the raw data thus acquired, the desired image data can finally be reconstructed. The region of the examination object in which the nuclear spins are excited is the examination region.

For a particular scan, a magnetic resonance control sequence (MR control sequence) (also known as a "pulse sequence"), composed of a sequence of RF pulses, for example excitation pulses and refocusing pulses, as well as gradient pulses activated suitably coordinated therewith on various gradient axes along different spatial directions, is to be transmitted. Temporally adapted thereto, readout windows are set, which specify the time frames within which the induced MR signals are acquired.

The data space in which the MR signals exist is denoted the raw data domain. The MR signals are digitized and stored in a memory as complex numerical values at raw data points of the raw data domain as raw data. The raw data are reconstructed by a multidimensional Fourier transform into image data. The filling of the raw data memory with complex numerical values, that is, the distribution and/or arrangement of the raw data points in the raw data domain influences the image data. For a correct reproduction of the anatomy of the examination object, the distribution and/or arrangement of the raw data points in the raw data memory is determined by the Nyquist criterion, dependent upon the size of the examination region and the resolution of the image data. The raw data points are arranged in the raw data memory such that the Nyquist criterion is met, provided image data are reconstructed based upon all the raw data points.

The acquisition of the MR signals, in particular the sampling (filling) of the raw data memory is time-consuming. In order to keep the duration for an examination as low as possible, having regard to cost-efficiency, patient comfort and movement artifacts, MR signals are often acquired only at some of the raw data points in the raw data memory determined by the Nyquist criterion. The raw data domain is thereby undersampled. In the context of the undersampling, raw data points that are not occupied (not sampled), can be given a data value such as by utilizing reception sensitivities of a number of receiving coils in the context of parallel imaging. In the "partial Fourier" method, it is sufficient to sample somewhat more than a spatial half of the raw data points of the raw data memory and to occupy the non-sampled raw data points on the basis of symmetry properties. In the parallel imaging and in the "partial Fourier" method, therefore, non-sampled raw data points can subsequently be occupied on the basis of further findings, so that the Nyquist criterion is satisfied in the reconstruction. Disadvantages of such techniques are ring artifacts and signal losses. A further possibility for reducing the MR signals to be recorded is to reduce the resolution of the image data. According to the Nyquist criterion, this requires a smaller number of raw data points. However, a lower resolution of the image data is typically not desirable in magnetic resonance imaging (MR imaging).

In diffusion-weighted magnetic resonance imaging (diffusion imaging), the diffusion movement of particular substances in the body tissue can be measured and represented in a spatially resolved manner. Diffusion imaging has become established in clinical routine, particularly for neurological investigations. Additionally, diffusion imaging is used to an increasing extent in the field of oncological, cardiological and musculoskeletal diseases.

In diffusion-weighted magnetic resonance imaging, the raw data that are acquired are diffusion-weighted. The strength of the diffusion weighting is defined by the so-called diffusion weighting factor, also called the b-value. In the context of diffusion-weighted magnetic resonance imaging, raw data of the examination region are typically recorded with different diffusion weighting factors, (different b-values). The raw data are thereby diffusion-weighted with different strengths, image data of the examination region are thereby weighted by reconstruction with the corresponding b-values. Based on the image data that have been reconstructed with diffusion-weighted strengths, a parameter map can be determined that represents a free diffusion process with an apparent diffusion coefficient (ADC).

SUMMARY OF THE INVENTION

The recording of diffusion-weighted raw data typically takes place on the basis of an echo-planar MR control sequence. In echo-planar MR control sequences, a signal loss can be prevented by a short echo time, in particular by a rapid sampling of the raw data domain. It is an object of the invention to provide a particularly efficient method for generating diffusion-weighted image data.

The inventive method for generating diffusion-weighted image data by the operation of a magnetic resonance apparatus involves at least two recordings (data acquisitions) in each of which raw data are acquired at raw data points of the raw data domain weighted with a b-value. In accordance with the invention, the raw data memory has a first subregion and a second subregion, with the first subregion having more than half of the raw data points of the raw data memory. In the at least two recordings of the first subregion, full sampling takes place in each recording, and the second subregion is acquired with a different undersampling in the respective recordings. The raw data are combined in a computer, and are reconstructed into image data weighted with the b-value.

The invention is based on the insight that the echo time in echo-planar MR imaging can be reduced by a reduction in the raw data to be recorded. Known recording techniques with undersampling, such as parallel imaging or the "partial Fourier" method, enable a reconstruction of image data on the basis of an undersampled raw data memory. In accordance with the invention, it has been recognized that in the diffusion-weighted MR imaging, (i.e., in the recording of diffusion-weighted raw data), particularly with echo-planar MR control sequences, in the context of an MR control sequence, raw data with the same b-value is recorded repeatedly. If, for example, raw data are recorded three times with the same b-value, three image data sets of the same examination region can be reconstructed weighted with the same b-value and the three image data sets are then averaged. The averaged image data typically have an improved signal-to-noise ratio compared with the non-averaged, separate image data sets. The inventive method is based on repeated recordings with different scan patterns for undersampling the raw data memory. Thus, the method includes at least two recordings with different scan patterns. The at least two recordings are defined by an MR control sequence.

A scan pattern specifies the raw data points of the raw data memory to be sampled (filled) in the context of a recording. If all the raw data points of the raw data memory have been sampled in the context of a recording, the raw data space is completely sampled and the Nyquist criterion is met. In this case, the reconstruction can take place on the basis of a Fourier transform. Further techniques, for example, parallel imaging or the "partial Fourier" method for filling unsampled raw data points are not required in this case. If only some of the raw data points of the raw data memory are sampled in the context of a recording, then the raw data domain, and thus the raw data memory, are undersampled.

The raw data memory is subdivided, according to the invention, into a first subregion and a second subregion. The first subregion and the second subregion are respectively a first subset and a second subset of the totality raw data points in the raw data memory. The union of the raw data points covered by the first subregion and the second subregion preferably corresponds to the totality of raw data points in the raw data memory. The first subregion and the second subregion are preferably disjoint (non-overlapping). The first subregion is preferably a coherent (unbroken) region of raw data points. The second subregion is preferably a coherent region of raw data points. A coherent region of raw data points typically includes respectively adjacent raw data points. The first scan pattern typically differs from the second scan pattern at least at one raw data point.

A first scan pattern of a first of the at least two recordings differs from a second scan pattern of a second of the at least two recordings. The first scan pattern typically differs from the second scan pattern in the second subregion.

The combination of the raw data takes place in the computer in the raw data domain. The raw data points occupied in the context of the at least two recordings are consolidated. The combination can be an overlaying and/or a mean value formation of the raw data acquired in the context of the at least two recordings. The combination of the raw data preferably is a mean value formation of the acquired raw data of the first subregion and a consolidation of the acquired raw data of the second subregion. Preferably, the acquired raw data of the raw data points that have been acquired from more than one of the at least two recordings are averaged. Preferably, raw data points of the first subregion are averaged. Preferably, raw data at raw data points that have been acquired from precisely one of the at least two recordings are recorded during the consolidation and/or the combination as raw data and/or as complex values as such. Following the combination of the raw data acquired in the context of the at least two recordings, the first subregion of the raw data space is preferably fully occupied. The second subregion of the raw data space is preferably partially occupied. The occupation of the second subregion after the combination in the event of not completely consolidated sampling of the second subregion corresponds to a scan pattern that enables a reconstruction by execution of an algorithm for parallel reconstruction.

The reconstruction can take place on the basis of the combined raw data as, for example, a Fourier transform. The use of particular reconstruction algorithms such as algorithms for parallel reconstruction may be required if, after combination of the raw data, the raw data space is not fully occupied. On the basis of an algorithm for parallel reconstruction, for example, non-occupied raw data points can be taken into account in the reconstruction.

An advantage of the inventive method is that diffusion-weighted image data can be generated particularly efficiently. The repetition and mean value formation from a number of recordings with the same b-value, which are typically required for echo-planar imaging, is used to sample the raw data space as completely as possible. The duration of the at least two recordings, preferably the duration of the entire MR control sequence, is not prolonged compared with conventional repeated recordings. In comparison with conventional repeated recordings, following the combination, typically a greater part of the raw data space is occupied. This increases the efficiency of the MR control sequence and/or the recordings. The signal-to-noise ratio in the image data can be increased, and the use of algorithms for the compensation of undersampled raw data, such as algorithms for "partial Fourier" methods, can be reduced or avoided. Artifacts due to the "partial Fourier" method and/or parallel imaging, such as ring artifacts and signal losses, thus can be reduced or eliminated. In addition, the recording can take place particularly time-efficiently according to the inventive method.

The efficient sampling of the raw data space enables particularly short echo times, which in echo-planar MR imaging reduces signal losses and/or the T2 decay and/or the T2* decay. The inventive method can be used to compensate for a lower output of a gradient coil arrangement of a magnetic resonance scanner, because a longer echo time in the echo-planar MR imaging due to the lower power of the gradient coil arrangement can be shortened to the original duration by the inventive method.

As an alternative to the inventive method, in at least one recording of the at least two recordings, the first subregion can also be acquired undersampled. The degree of undersampling of the first subregion can differ from the degree of undersampling of the second subregion in a first or second scan pattern of the at least two recordings. The degree of undersampling of the first subregion is preferably lower than the degree of undersampling of the second subregion in the first or second scan pattern of the at least two recordings. The A second scan pattern of the at least two recordings can be configured such that the first subregion is acquired undersampled. The degree of undersampling of the first subregion can differ between the first scan pattern and in the second scan pattern.

In an embodiment of the invention, the at least two recordings are configured such that the raw data memory is fully sampled in the context of the at least two recordings, meaning that the raw data acquired in the context of the at least two recordings meet the Nyquist criterion. On the basis of the at least two recordings, raw data are acquired at all raw data points of the raw data memory. The reconstruction to diffusion-weighted image data thus can take place on the basis of the combined raw data, for example by a Fourier transform. Complex algorithms for taking account of non-occupied raw data points can be dispensed with. This means that, without reduction of the signal-to-noise ratio, artifacts resulting from the complex algorithms can be prevented.

In another embodiment of the method, the undersampling of the second subregion is different between the at least two recordings. The first scan pattern for at least one raw data point typically differs from the second scan pattern, with at least one raw data point being covered by the second subregion. According to this embodiment, a complete recording of the raw data space according to the at least two recordings is possible. Diffusion-weighted image data thus can be generated particularly efficiently.

In another embodiment of the method, the degree of undersampling corresponds to the number of the at least two recordings. The degree of undersampling relates to the undersampling of the second subregion. Particularly with parallel imaging, the degree of undersampling determines the density of the sampled rows of the raw data space. Thus, for example, in an undersampling of level four, every fourth row of the raw data space is sampled. If the corresponding MR control sequence for this embodiment of the inventive method provides for four recordings, that is, four mutually different scan patterns, then each scan pattern can involve raw data from a different row of the raw data space. In summary, according to this embodiment, the second subregion is fully sampled taking account of the at least two recordings. Complex algorithms for taking account of non-occupied raw data points thus can be dispensed with. Moreover, without reduction of the signal-to-noise ratio, artifacts resulting from the complex algorithms can be prevented. In addition, according to this embodiment, the raw data of one of the at least two recordings can be configured so as to be reconstructable with a parallel imaging reconstruction algorithm. Similarly, the raw data of a recording can be configured so as to allow a phase map to be determined in the resolution of the image data.

In an embodiment of the method, the first subregion is a region around the center of the raw data memory. The center of the raw data memory is typically defined by the value k=0. A region round the center of the raw data memory can be, for example, between 3 and 30, preferably between 5 and 20, particularly preferably between 5 and 15 adjacent straight lines, each containing raw data points of a row of the raw data memory. These adjacent straight lines preferably include the center of the raw data space or enclose it centrally. Raw data in the center and in the region round the center and the primary source for the contrast of the image data to be reconstructed from the raw data. The center and the region round the center are therefore essential for quality image data. Similarly, with undersampled raw data, a calibration for the combination and/or reconstruction typically takes place based on raw data in the center or in the region round the center. This applies, for example, for a GRAPPA calibration. The calibration is essential for the quality of the resultant image data. Similarly, raw data in the region round the center of the raw data space can be used for phase correction, in particular for intrinsic phase correction. Consequently, in the region round the center, fully sampled raw data can be used for different quality-improving measures.

In another embodiment of the method, the first recording and/or the second recording takes place with the acquired data being entered into the raw data memory in a Cartesian manner. An advantage of raw data recorded in a Cartesian manner is that the image data can be reconstructed using a Cartesian-based reconstruction algorithm. In addition, geometric distortions in Cartesian recordings are typically low or readily correctable. Non-linear sampling of the raw data space can bring about non-linear distortions in the image data that are difficult to correct.

In another embodiment of the method, the aforementioned value is a first b-value, and at least one further recording of further raw data is implemented with a second b-value. The further raw data are reconstructed into further image data weighted with a second b-value and, based upon the image data weighted with the first b-value and the further image data weighted with the second b-value, diffusion is determined.

In order to quantify a free diffusion process, typically the apparent diffusion coefficient (ADC), which is specified in the form of a spatially resolved ADC map, is determined. Diffusion can be identified on the basis of an ADC map. In order to determine the ADC map, typically a number of sets of image data, respectively weighted with different b-values, are required. According to this embodiment, image data are produced weighted with the second b-value. The image data weighted with the second b-value are preferably based on at least one further recording of further raw data with the second b-value. The image data weighted with the second b-value are preferably produced similarly to the image data weighted with the first b-value, and also based on at least two recordings. In the context of the further recording, the first subregion is thus fully sampled and the second subregion is acquired undersampled. The second b-value differs from the first b-value.

An advantage of this embodiment of the method is that it enables a better determination of the diffusion. The method according to the invention can be used to generate further diffusion-weighted image data. The image data required for determining the diffusion can be generated in an efficient and time-saving manner, so the diffusion also can be determined efficiently and with time-saving.

In another embodiment of the method, a phase correction of the raw data acquired in the context of the at least two recordings is implemented. In gradient echo-based MR imaging, in particular in echo-planar MR imaging, a correction of the phase is essential. A spatial variation of the phase often occurs due to the basic magnetic field not being perfectly homogeneous, or due to movement of the examination object during a diffusion encoding gradient for diffusion weighting. When raw data of different recordings are combined for the reconstruction of image data, a phase correction of the individual recordings is advantageous. This can be done, for example, according to the procedure described in Chang et al, "Interleaved Diffusion-Weighted EPI Improved by Adaptive Partial-Fourier and Multiband Multiplexed Sensitivity-Encoding Reconstruction", doi 10.1002/mrm.25318, MRM or in accordance with WO 2015 184 226 A1.

In an embodiment of the method, the phase correction is implemented by determining a first phase map on the basis of first raw data acquired in the context of a first recording of the at least two recordings, determining a phase difference on the basis of the first phase map and a reference phase map, and compensating the phase difference in the first raw data.

The phase map represents the phase in a spatially resolved manner. The first phase map shows the spatially resolved image phase in the first recording, that is, the phase of the first raw data in the image domain. As noted, the raw data are complex numerical values. When the raw data are transformed in the image domain, typically by a Fourier transform, then the image phase is determined by the phase angle of the complex image data, i.e., the complex numerical values in the image domain. The first phase map thus can be determined by Fourier transformation of the first raw data. If the first raw data are completely taken into account, an algorithm is typically required to compensate for the undersampling of the second subregion. Preferably only a subset of the first raw data is taken into account. Preferably, the first raw data in the region round the center of the raw data space is taken into account in the determination of the first phase map. The region round the center of the raw data space is preferably included by the first subregion.

Consequently, the raw data are preferably recorded in the region round the center of the raw data space for all the recordings, and a comparable phase map is generated for all the recordings. The first phase map on the basis of the region round the center of the raw data space typically has a lower resolution than the image data weighted with the first b-value.

The reference phase map is typically a phase map based on reference raw data. The raw data points of the raw data taken into account for the reference phase map preferably correspond to the raw data points of the raw data taken into account for the first phase map. The raw data points of the raw data taken into account for the reference phase map preferably correspond to the region round the center of the raw data space. The reference phase map and the first phase map preferably have a similar resolution. The reference phase map can be based, for example, on second raw data acquired in the context of a second recording of the at least two recordings. The reference phase map can be a mean value of the raw data acquired in the context of the at least two recordings and/or of the raw data acquired in the context of the MR control sequence. The reference phase map can be based, for example, on raw data which is weighted with a b-value equal to zero. The reference phase map enables an intrinsic phase correction.

The phase difference can be determined by subtraction of the first phase map and the reference phase map. The phase difference is preferably spatially resolved. The spatial resolution of the phase difference preferably corresponds to the spatial resolution of the reference phase map and/or the first phase map. The compensation of the phase difference preferably comprises an elimination of the influence of the phase difference on the first raw data. Preferably, this embodiment of the method is carried out similarly for further raw data of the at least two recordings with a first b-value and/or for further recordings weighted with a second b-value.

This embodiment of the method enables an intrinsic phase correction. The phase can be precisely determined on the basis of the determination of a phase map based upon the first raw data, which is used for generating the image data, and the phase can be efficiently corrected. If this embodiment of the method is carried out for each of the at least two recordings, and preferably for each weighting in the context of an MR control sequence, then the phase can be monitored and/or determined continuously and consequently continuously corrected.

In an embodiment of the method, the compensation of the phase difference is implemented by reconstruction of the first raw data to preliminary image data, removal of the phase difference from the preliminary image data, and inverse transformation in the raw data domain of the preliminary image data from which the phase difference was removed.

The compensation of the phase difference in the first raw data preferably takes place in the image domain in which the phase difference is also present spatially resolved. For this purpose, the first raw data are reconstructed to preliminary image data, wherein typically an algorithm for compensation of the undersampling of the second subregion is required. For this purpose, a method for parallel reconstruction or the "partial Fourier" method can be utilized. Advantageously, the second subregion has been sampled on recording the first raw data such that such a reconstruction of this type to preliminary image data is possible despite the undersampling thereof.

The preliminary image data include phase information, in particular the imaginary part of the transformed complex numerical values. The phase difference can then be subtracted from the preliminary image data. Since the combination of the raw data takes place in the raw data domain, the compensation involves an inverse transformation into the raw data domain. The raw data points not sampled in the second subregion in the context of the undersampling of the first recording are eliminated from the phase-corrected raw data in the raw data domain.

This embodiment of the method is carried out similarly for further raw data of the at least two recordings with a first b-value and/or for further recordings weighted with a second b-value. Deviations of the phase in the raw data can be eliminated with a high level of precisions according to this embodiment.

In another embodiment of the method, a geometric distortion correction is implemented. Deviations in the homogeneity of the basic magnetic field in the examination region can generate a geometric distortion. The publication by Zeller et al., "Phase-Labeled Reference EPI for Frequency-Segmented Inhomogeneity Corrections (PREFICS)", doi 10.1002/mrm.24737, MRM, describes a suitable method for geometrical distortion correction.

The geometrical distortion correction can be applied, for example, to the raw data acquired with a recording of the at least two recordings. It is also possible for the raw data acquired with a first recording of the at least two recordings to be first reconstructed to first image data and the geometrical distortion correction is applied to the first image data. Similarly, the raw data acquired with a second recording of the at least two recordings is first reconstructed to second image data and the geometrical distortion correction is applied to the second image data. The distortion-corrected first image data and/or the second image data can then be transformed into the raw data domain before the combination according to the inventive method. The geometrical distortion correction thus can be readily combined with the phase correction. Similarly, the geometrical distortion correction can be applied to the image data weighted with the first b-value. This is advantageous if the scan patterns of the at least two recordings deviate only slightly from one another.

This embodiment of the method enables an efficient correction of geometrical distortions, which occur particularly with non-linear scan patterns, such as with non-Cartesian scan patterns with field strengths of at least 1.5 tesla, in particular with field strengths of at least 3 tesla.

Furthermore, the invention encompasses a magnetic resonance apparatus that has an MR data acquisition scanner and a control computer that includes a combination processor and a reconstruction processor. The control computer is configured to implement the method according to the invention for generating diffusion-weighted image data.

For this purpose, the control computer has at least one input and an output. Via the input, an MR control sequence or a scan pattern or information relating to the raw data domain or the first and/or second subregion can be provided to the control computer. Via the input, an algorithm and parameters for combination and phase correction and acquired raw data can be provided to the control computer. Via the input, a reconstruction algorithm can be provided to the control computer.

Further functions, algorithms or parameters required in the method can be provided to the control computer via the input. A scan pattern and/or recorded raw data and/or combined raw data and/or image data weighted with the first b-value and/or further results of an embodiment of the method according to the invention can be provided via the output. The control computer and the scanner and the combination processor and the reconstruction processor are typically connected to one another and can be integrated into the magnetic resonance apparatus or installed separately from the magnetic resonance apparatus or connected to the magnetic resonance device.

Embodiments of the magnetic resonance device according to the invention correspond to the embodiments of the method according to the invention. The magnetic resonance apparatus can have further components that are necessary or advantageous for carrying out the method according to the invention. The magnetic resonance apparatus can also be configured to transmit control signals and to receive and process control signals in order to carry out the method according to the invention. Preferably, the combination processor and/or the reconstruction processor is part of the control computer of the magnetic resonance apparatus according to the invention. In a memory of the control computer, computer programs and other software can be stored, with which the processors of the control computer automatically implement the sequence of the method according to the invention.

The present invention also encompasses a non-transitory, computer-readable data storage medium encoded with programming instructions that, when the storage medium is loaded into a computer or computer system of an MR apparatus, cause the computer or computer system to operate the MR apparatus so as to implement any or all embodiments of the method according to the invention, as described above.

Examples of electronically readable data carriers are a DVD, a magnetic tape or a USB stick, on which electronically readable control information, in particular software, is stored.

The advantages of the magnetic resonance apparatus according to the invention and the electronically readable data carrier according to the invention substantially correspond to the advantages of the method according to the invention as described in detail above. Features, advantages or alternative embodiments noted with regard to the method also apply to the other aspects of the invention.

DESCRIPTION OF THE PREFERRED EMBODIMENTS

Figure 1:
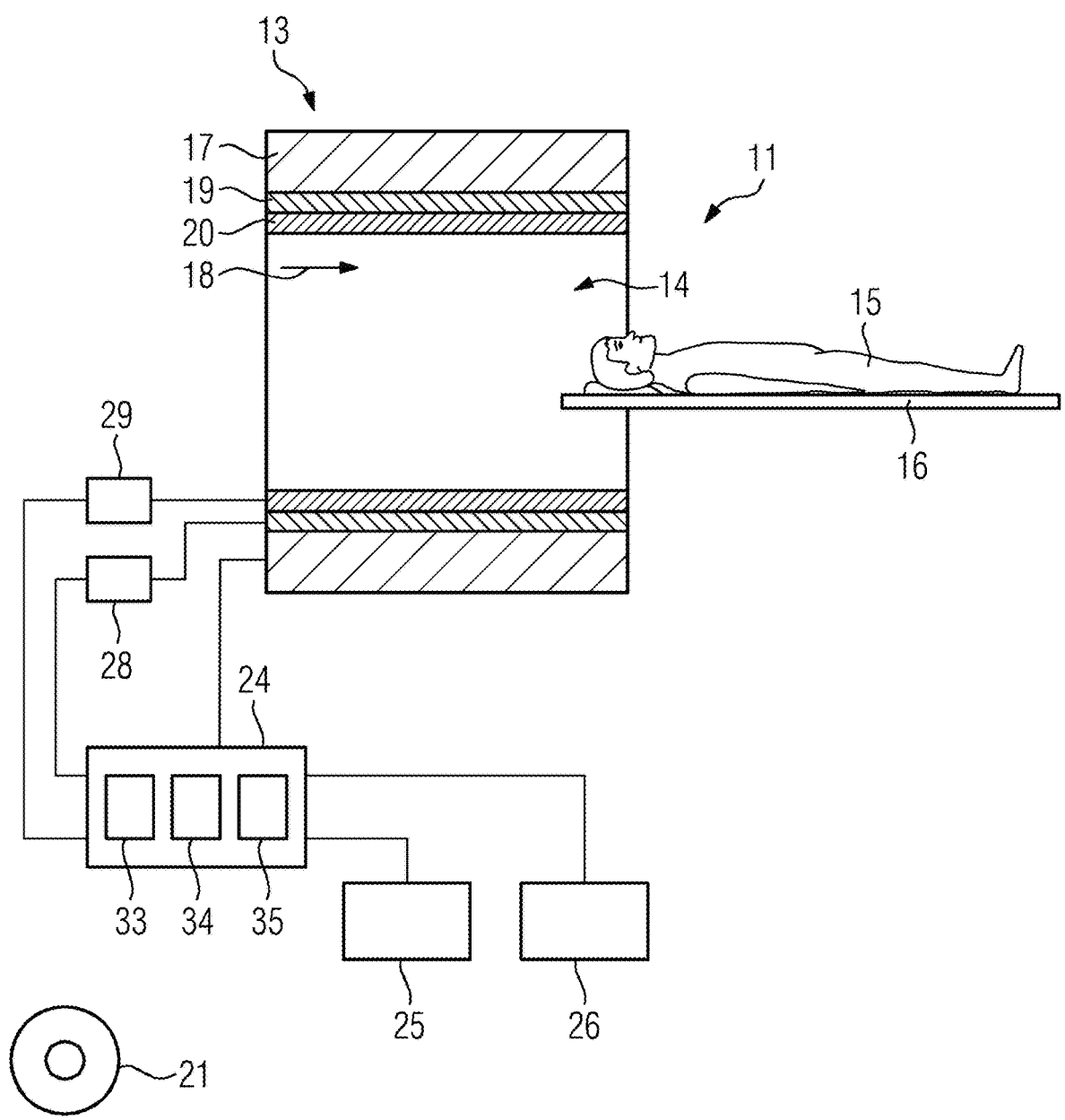
FIG. 1 is a schematic illustration of a magnetic resonance apparatus according to the invention.

FIG. 1 shows a magnetic resonance apparatus 11 for carrying out the method according to the invention, in a schematic illustration. The magnetic resonance apparatus 11 has a scanner 13 with a basic field magnet 17 that generates a strong and constant basic magnetic field 18. The magnetic resonance scanner 13 has a cylindrical patient receiving region 14 for accommodating a patient 15. The patient receiving region 14 is cylindrically enclosed at its periphery by the scanner 13. The patient 15 can be pushed by a patient support 16 into the patient receiving region 14. The patient support 16 has a patient table that is movable within the scanner 13.

The scanner 13 also has a gradient coil arrangement 19 for spatially encoding the MR signals during an imaging procedure. The gradient coil arrangement 19 is operated by a gradient controller 28. Furthermore, the scanner 13 has an RF antenna 20 that, in the case shown, is configured as a body coil rigidly integrated into the scanner 13, and an RF antenna controller 29 that operates the RF antenna 20 so as to radiate RF pulses into an examination space that is substantially formed by the patient receiving region 14. The radiated RF pulses give certain nuclear spins in the patient 15 a magnetization that causes those excited nuclear spins to be deflected from the field mines of the basic magnetic field 18. As those excited nuclear spins relax, and return to the steady state, they emit RF signals (MR signals), which are detected by the same antenna from which the RF pulses were radiated, or by a different antenna.

For controlling the basic field magnet 17, the gradient controller 28 and the RF antenna controller 29, the magnetic resonance apparatus 11 has a control computer 24. The control computer 24 centrally controls the magnetic resonance apparatus 11 for the execution of MR control sequences. The magnetic resonance apparatus 11 has a display unit 25. Control information such as control parameters and reconstructed image data can be displayed on the display unit 25, for example on at least one monitor, for a user. The magnetic resonance apparatus 11 has an input unit 26 via which information and/or control parameters can be entered by a user during a scanning procedure. The control computer 24 can include the gradient controller 28 and/or the RF antenna controller 29 and/or the display unit 25 and/or the input unit 26.

The control computer 24 further has a scanning processor 33, a combination processor 34 and a reconstruction processor 35. The scanning processor 33 is configured to enter the raw data acquired by the scanner 13 into raw data points 43 of a raw data memory 40. The combination processor 34 is configured to combine raw data of the at least two recordings and/or to carry out a phase correction of raw data, in particular the raw data acquired in the context of the at least two recordings. The reconstruction processor 35 is configured to reconstruct image data from the raw data, in particular for reconstruction of diffusion-weighted image data. Furthermore, the reconstruction processor 35 is configured to reconstruct medical image data acquired during the magnetic resonance examination. The control computer 24 can also have a determining processor (not shown) for determining diffusion on the basis of image data weighted with a first b-value and image data weighted with a second b-value.

The control computer 24 is configured with the scanning processor 33, the combination processor 34 and the reconstruction processor 35 for carrying out the method according to the invention for generating diffusion-weighted image data. In order to implement the method according to the invention as described in more detail below, a non-transitory, computer-readable data carrier (data storage medium) 21 is loaded into the control computer 24, so that the relevant programming instructions are distributively provided to the scanning processor 33, the combination processor 34 and the reconstruction processor 35. The programming instructions (program code) cause the method according to the invention to be implemented by those components.

The magnetic resonance apparatus 11 can have further components that are common for magnetic resonance apparatuses. The general mode of operation of a magnetic resonance apparatus is known to those skilled in the art, so that a more detailed description is not necessary herein.

Figure 2:
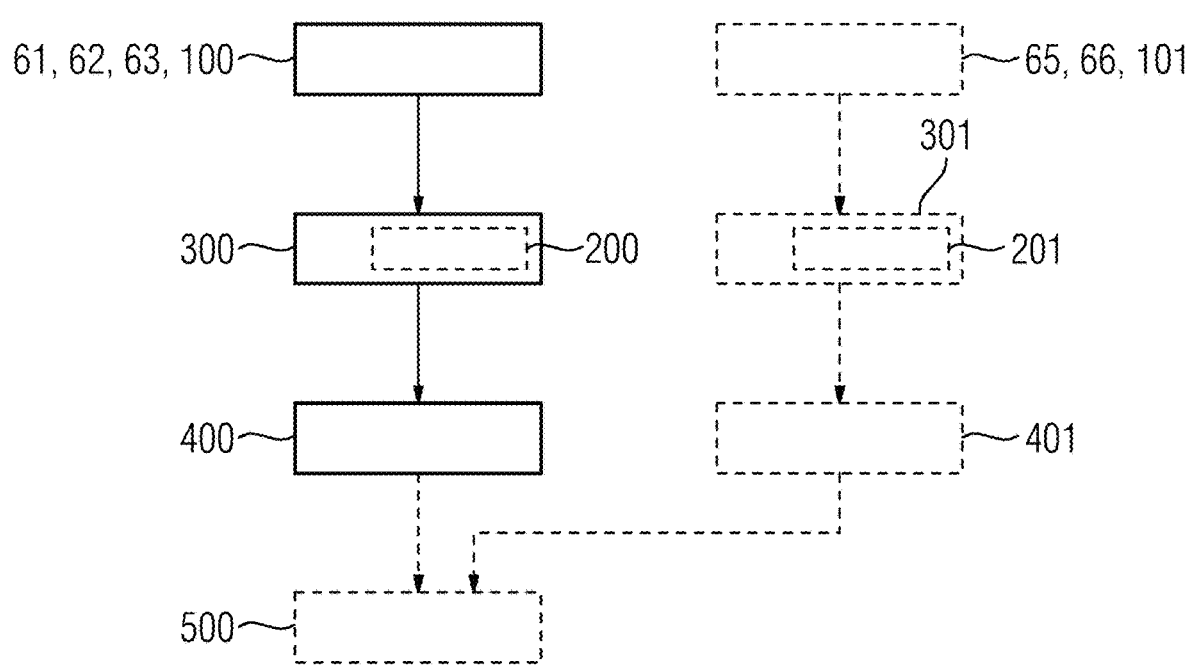
FIG. 2 is a flowchart of an embodiment of the method according to the invention.

FIG. 2 shows a flowchart of an embodiment of the method according to the invention. For generating diffusion-weighted image data by operation of the magnetic resonance apparatus 11, in method step 100 raw data are acquired at raw data points of a raw data memory, weighted with a b-value, by executing at least two recordings 61, 62, 63. In the at least two recordings 61, 62, 63, the first subregion is fully sampled in each case, and the second subregion is acquired with different undersampling in the respective recordings. In the method step 300, the raw data points acquired in the context of the at least two recordings 61, 62, 63 are combined. The combination in the method step 300 can optionally include the method step 200, which is a phase correction of the raw data acquired in the context of the at least two recordings 61, 62, 63. The optional phase correction in the method step 200 preferably takes place separately for each of the at least two recordings 61, 62, 63. The raw data sets, preferably the phase-corrected raw data according to method step 200, are combined with one another in method step 300 such that the combined raw data can be reconstructed in method step 400 to image data 71 weighted with the b-value.

The method can optionally include method step 101, which includes at least one further recording 65, 66 of further raw data with a second b-value (in which case the aforementioned b-value is a first b-value). Similarly to method step 100, method step 101 includes at least two further recordings 65, 66 of further raw data in which, with the second b-value, the first subregion is fully sampled in each case and the second subregion is acquired with different undersampling. The further raw data can also be combined in method step 301 wherein the combination can optionally include method step 201, which is a phase correction of the raw data. The combined raw data are reconstructed in method step 401 into image data weighted with the second b-value. On the basis of the image data 71, weighted with the first b-value resulting from method step 400 and the image data weighted with the second b-value resulting from method step 401, a diffusion can be determined in method step 500. Optionally, the phase correction in method step 200 and/or method step 201 and/or the reconstruction in method step 400 and/or method step 401 can include a geometric distortion correction.

Figure 3:
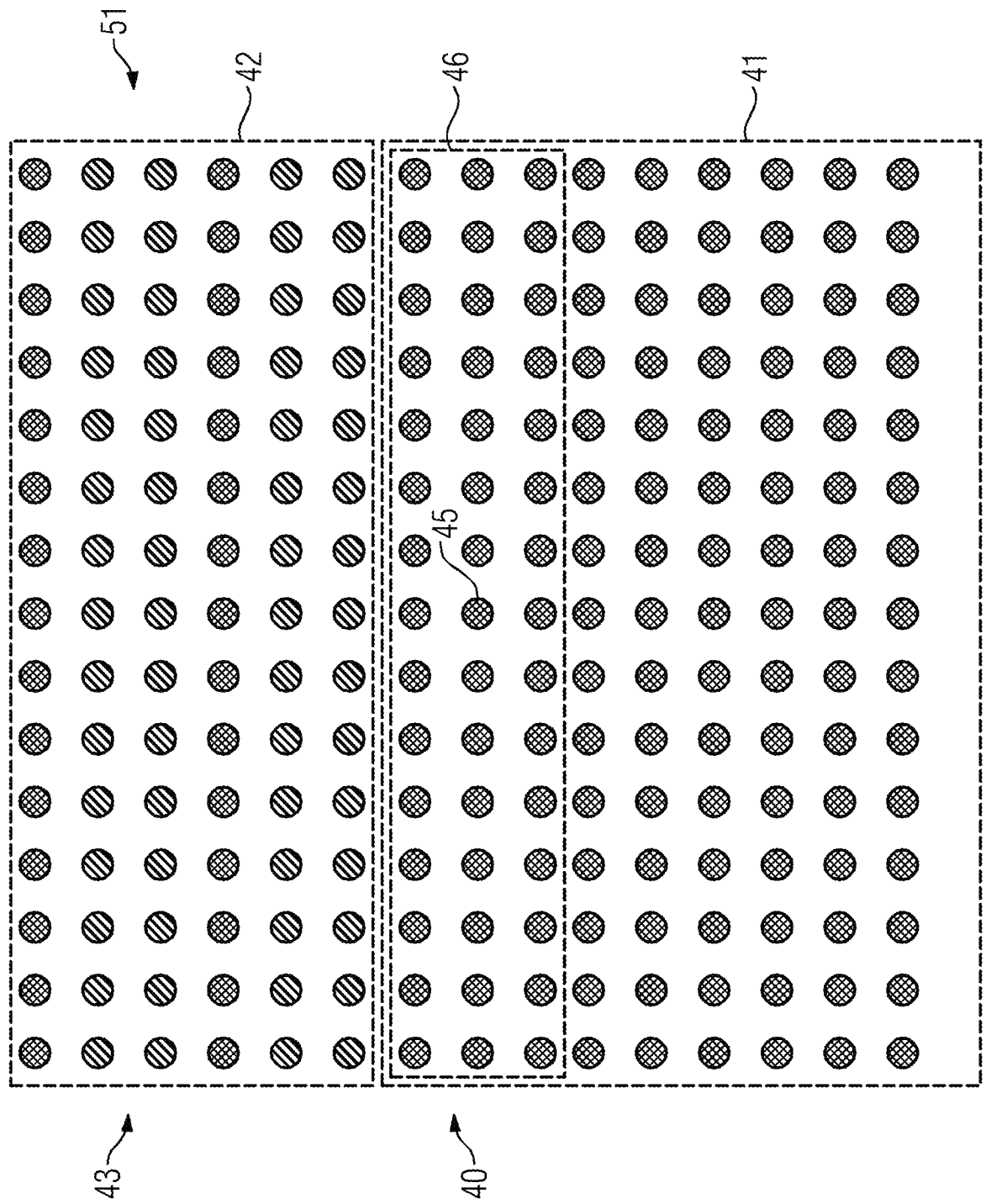
FIG. 3 shows an embodiment of a first scan pattern usable in accordance with the invention.

FIG. 3 shows an embodiment of a first scan pattern 51 of the raw data memory 40 according to a first recording 61 of the at least two recordings 61, 62, 63 with a first b-value. The raw data memory 40 has a number of raw data points 43 arranged in a Cartesian manner and the raw data memory 40 is subdivided into a first subregion 41 and into a second subregion 42. The first subregion 41 contains more than half of the raw data points 43 of the raw data memory 40. The first subregion 41 preferably includes a region 46 around the center 45 of the raw data memory 40. The coordinate system underlying the raw data memory 40 is given in k-coordinates. The first scan pattern 51 visualizes the raw data points 43 acquired in the context of the first recording 61 as checkered, and those raw data points 43 not acquired by the first scan pattern 51 are shown striped.

Figure 4:
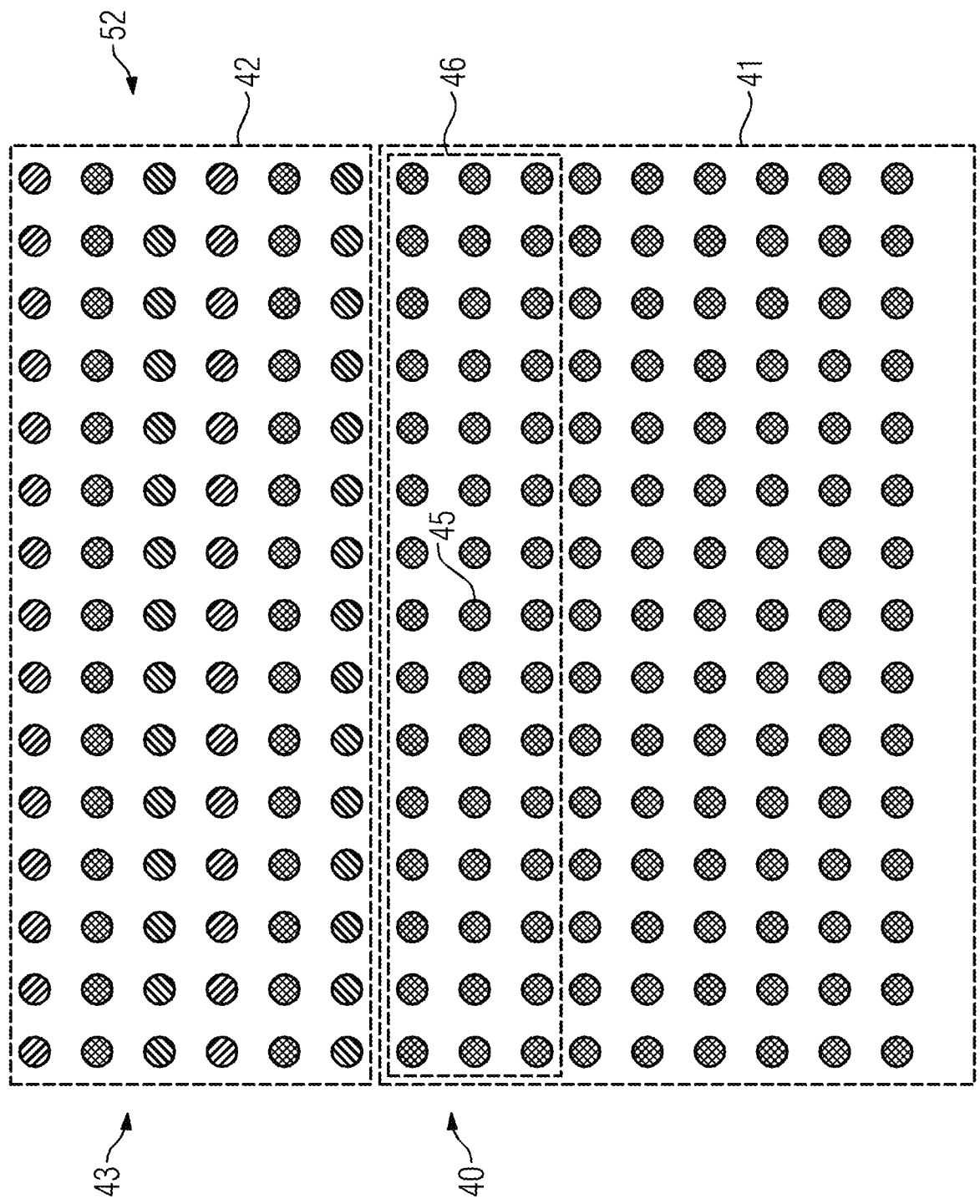
FIG. 4 shows an embodiment of a second scan pattern usable in accordance with the invention.
Figure 5:
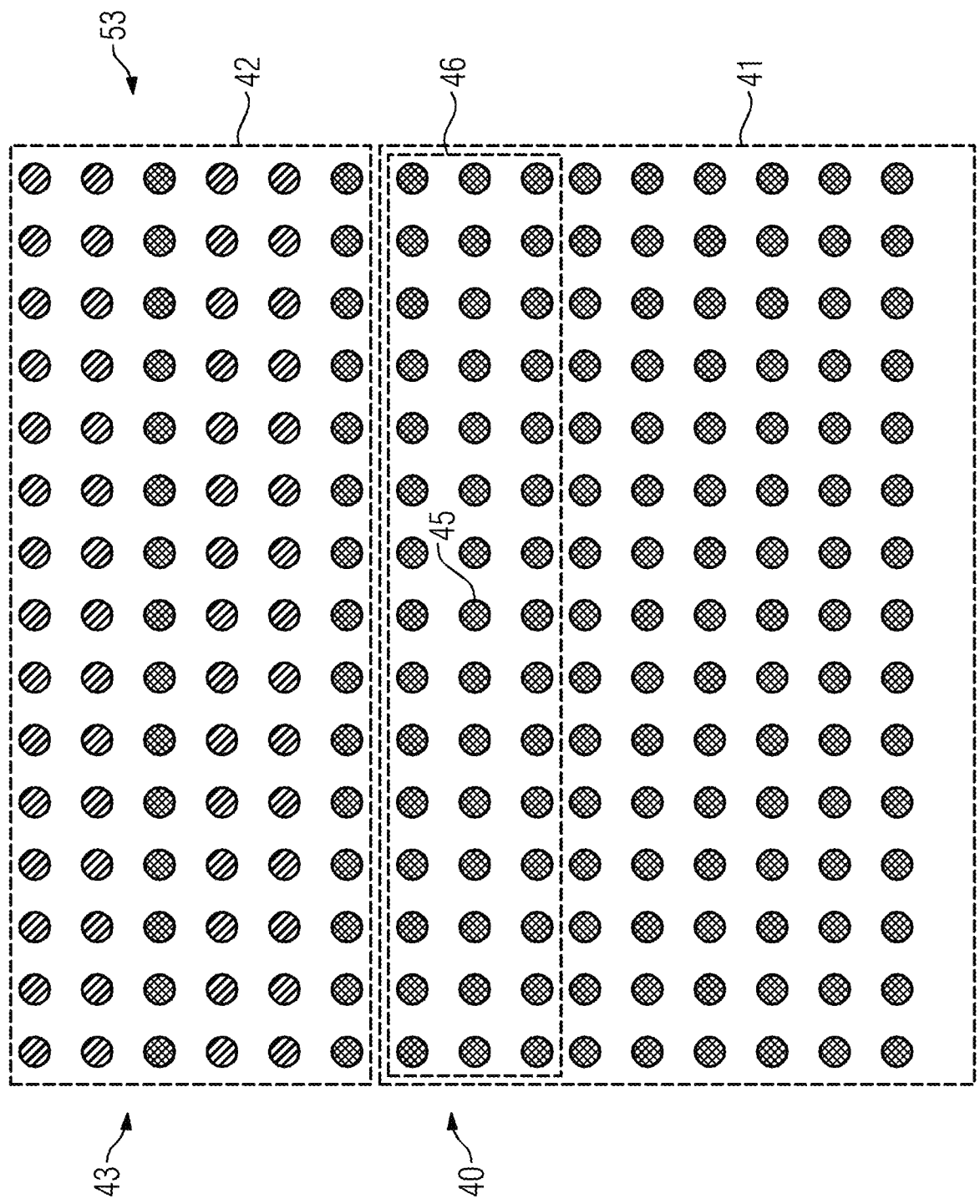
FIG. 5 shows an embodiment of a third scan pattern usable in accordance with the invention.
Figure 6:
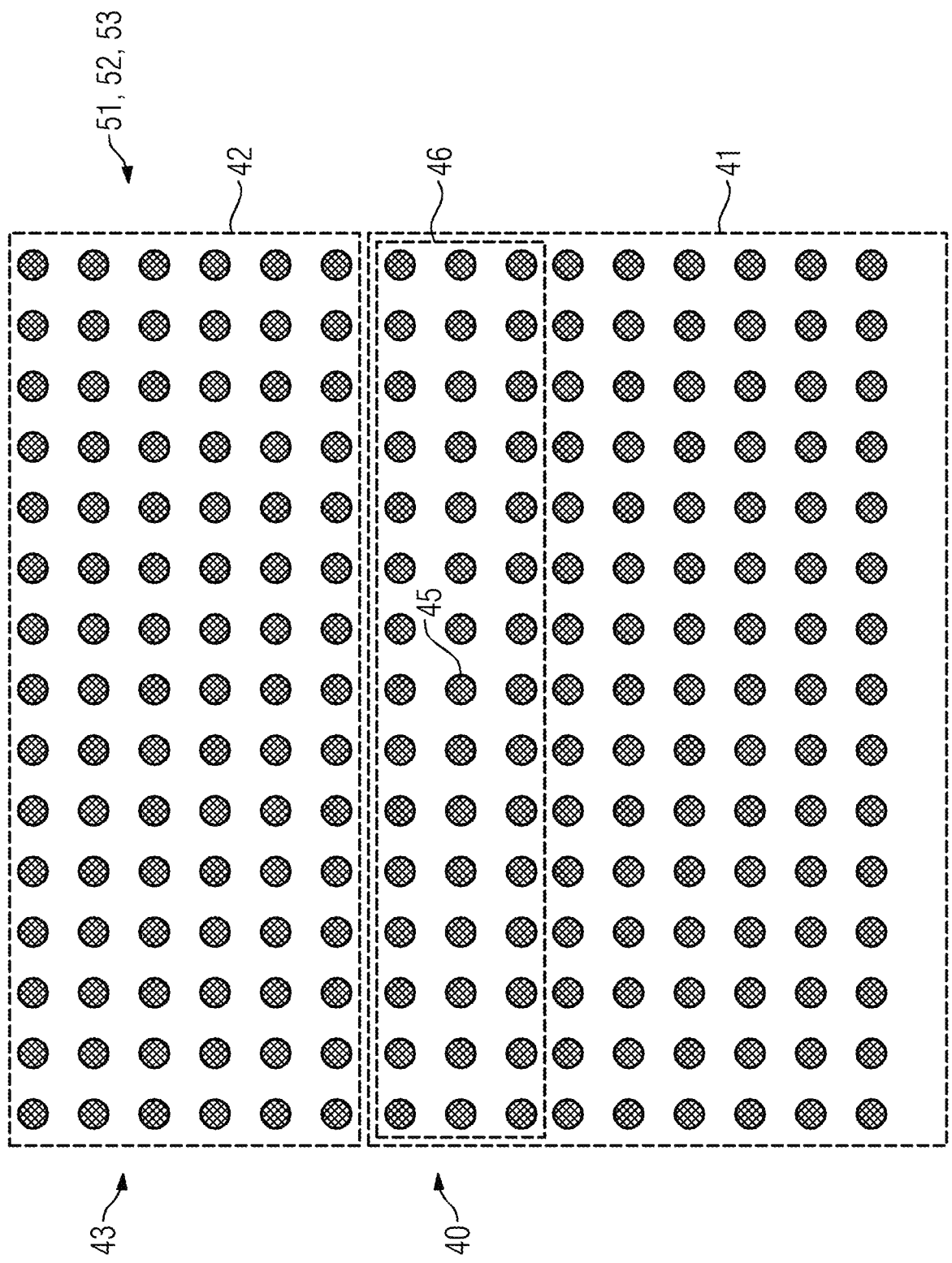
FIG. 6 shows an embodiment of a combination of the scan patterns usable in accordance with the invention.
Figure 7:
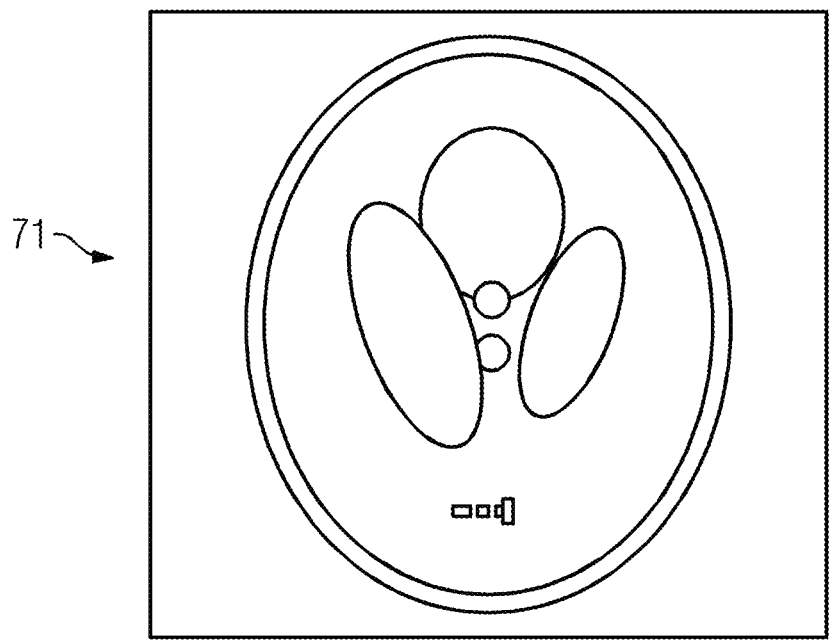
FIG. 7 shows an embodiment of image data usable in accordance with the invention.

FIG. 4 shows an embodiment of a second scan pattern 52 of the raw data memory 40 according to a second recording 62 of the at least two recordings 61, 62, 63 with a first b-value. FIG. 5 shows an embodiment of a third scan pattern 53 of the raw data memory 40 according to a third recording 63 of the at least two recordings 61, 62, 63 with a first b-value. The three scan patterns 51, 52, 53 are each Cartesian since the raw data memory 40 is acquired row by row. The first scan pattern 51, the second scan pattern 52 and the third scan pattern 53 of FIGS. 3 to 5 is different in the second subregion 42 in each case. The second subregion 42 is undersampled in each of the scan patterns 51, 52, 53, raw data points being acquired from every third row. The degree of undersampling, that is three, thus corresponds to the number of recordings with the three scan patterns 51, 52, 53. The first scan pattern 51, the second scan pattern 52 and the third scan pattern 53 of FIGS. 3 to 5 is enhanced by the scan patterns 51, 52, 53 sampling the raw data memory 40 completely, that is, they acquire all the raw data points 43. The combination of the raw data acquired according to the scan patterns 51, 52, 53 is shown in FIG. 6. The raw data points 43 of the raw data memory 40 are selected such that the Nyquist criterion is met, provided all the raw data points 43 are acquired. The raw data acquired according to the combination according to the scan patterns 51, 52, 53 therefore meet the Nyquist criterion. On the basis of raw data acquired according to the scan patterns 51, 52, 53 weighted with the first b-value, image data 71 weighted with the first b-value can be reconstructed, as is shown in FIG. 7. The image data 71 are in the image domain, not in the raw data domain represented in the raw data memory 40.

Figure 8:
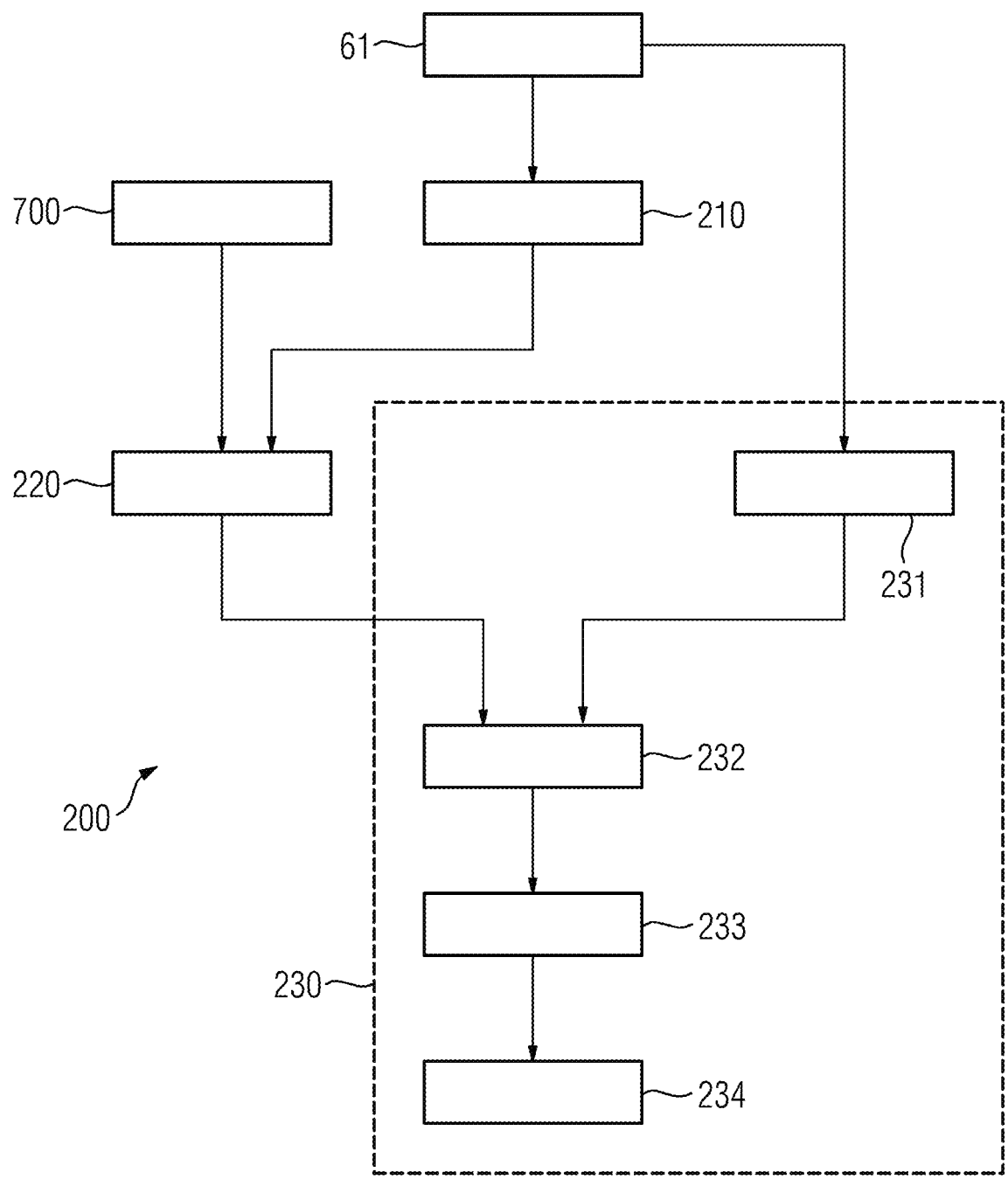
FIG. 8 is a flowchart of an embodiment of a phase correction usable in accordance with the invention.

FIG. 8 shows a flowchart of an embodiment of a phase correction according to method step 200. This method step 200 can be included by method step 300. Preferably, first the phase correction takes place according to the embodiment of the method described herein, before phase-corrected raw data according to the combination in method step 300 are combined with one another.

In method step 210, the determination of a first phase map on the basis of first raw data acquired in the context of a first recording 61 of the at least two recordings 61, 62, 63 takes place. The first raw data is thus weighted with the first b-value. For the determination of a first phase map, preferably only a first subset of the first raw data is taken into account. The first subset corresponds to the raw data points 43 in the region 46 round the center 45 of the raw data memory 40. This enables the determination of a phase map with lower resolution than the image data 71 reconstructed in method step 400 regardless of the first scan pattern 51 underlying the first recording 61.

In method step 700, the determination and/or provision of a reference phase map takes place. The reference phase map can have been determined once for the examination object in the context of the examination and/or can be based, for example, on reference raw data that has been recorded on the basis of one of the at least two recordings 61, 62, 63 and/or one of the further recordings 65, 66. The reference phase map is preferably based upon reference raw data which is weighted with a b-value equal to zero. For the determination of the reference phase map, a subset of the reference raw data is used, which corresponds to the first subset of the first raw data, in particular the raw data points 43 in the region 46 around the center 45 of the raw data memory 40.

Method step 220 includes the determination of a phase difference between the first phase map and the reference phase map. In method step 230, the compensation of the phase difference in the first raw data takes place. This can take place, for example, on the basis of the method steps 231, 232, 233 and 234. Method step 231 includes the reconstruction of the first raw data to preliminary image data. Since the first raw data are undersampled at least in the second subregion, in method step 231, techniques are preferably used for its reconstruction that are configured to compensate for such undersampling. For example, in method step 231, a reconstruction algorithm for parallel imaging can be used. On the basis of the phase difference determined in method step 220, this phase difference in the preliminary image data can be eliminated in method step 232. Subsequently, in method step 233, the preliminary image data can be inverse transformed into the raw data domain with the phase difference removed, whereby phase-corrected raw data are generated. During the inverse transformation into the raw data domain represented in the raw data memory 40, all the raw data points 43 of the raw data memory 40 are filled with phase-corrected raw data. The raw data points 43 not sampled in the second subregion 42 in the context of the undersampling of the first recording 61 are eliminated in method step 234 from the phase-corrected raw data. The thus phase-corrected raw data are subsequently provided for method step 300, the combination of the raw data. The combination takes place on the basis of the phase-corrected raw data from which particular raw data points have been removed according to method step 234.

The embodiment of the phase correction illustrated in FIG. 8 is preferably carried out separately for each of the at least two recordings 61, 62, 63 and/or further recordings 65, 66. The same reference phase map is preferably used in each case. In particular, for each of the at least two recordings 61, 62, 63 and/or further recordings 65, 66 with the same b-value, an identical reference phase map is preferably used.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating diffusion-weighted magnetic resonance (MR) image data, comprising:
   operating, via one or more processors, an MR data acquisition scanner to acquire at least two diffusion-weighted recordings of MR raw data that are weighted with a b-value, and entering the acquired diffusion-weighted recordings of MR raw data at respective data points of a raw data space that is stored in a raw data memory, said raw data space being divided into a first subregion and a second subregion, the first subregion including more than half of the raw data points in said raw data space,
   wherein entering the acquired diffusion-weighted recordings of the MR raw data at respective data points of the raw data space comprises:
      fully sampling the MR raw data by sampling the MR raw data at each of the raw data points in said first subregion for each of said at least two diffusion-weighted recordings, respectively; and
      undersampling the MR raw data by sampling the MR raw data at less than each of the raw data points in said second subregion for each of said at least two diffusion-weighted recordings, respectively, the undersampling being performed for the second subregion of one of the said at least two diffusion-weighted recordings using a different scan pattern than the undersampling of the second subregion of the other one of said at least two diffusion-weighted recordings; and
   combining and reconstructing, via one or more processors, the fully sampled MR raw data and the under-sampled MR raw data of the at least two diffusion-weighted recordings weighted with said b-value from the diffusion-weighted MR raw data entered in said first and second subregions of said raw data memory to generate diffusion-weighted MR image data that is weighted with said b-value.

2. The method as claimed in claim 1, comprising:
   operating said MR data acquisition scanner in each of said acquisitions of the at least two diffusion-weighted recordings by fully sampling said first subregion according to the Nyquist criterion.

3. The method as claimed in claim 1, wherein a degree of said undersampling of the MR raw data corresponds to how many of said acquisitions of the at least two diffusion-weighted recordings are implemented.

4. The method as claimed in claim 1, wherein said raw data space has a center, and
   wherein said first subregion is a region around said center of said raw data space.

5. The method as claimed in claim 1, comprising:
   entering the acquired at least two diffusion-weighted recordings of the MR raw data into said first and second subregions in a Cartesian manner.

6. The method as claimed in claim 1, wherein said b-value is a first b-value further comprising:
   operating said MR data acquisition scanner to acquire a second diffusion-weighted recording of diffusion-weighted MR raw data with a second b-value;
   combining and reconstructing further diffusion-weighted MR image data from said further diffusion-weighted MR raw data that is weighted with said second b-value; and
   identifying a diffusion from said diffusion-weighted MR image data weighted with said first b-value in said diffusion-weighted MR image data weighted with said second b-value.

7. The method as claimed in claim 1, comprising:
   executing a phase correction of the diffusion-weighted MR raw data acquired in said acquired at least two diffusion-weighted recordings of the MR raw data.

8. The method as claimed in claim 7, comprising:
   executing said phase correction by:
      determining a first phase map from first MR raw data acquired in a first acquisition among said at least two diffusion-weighted recordings of the MR raw data;

determining a phase difference between the first phase map and a reference phase map; and
compensating for said phase difference in said first MR raw data.

9. The method as claimed in claim 8 comprising compensating said phase difference in said computer by:
reconstructing preliminary image data from said first MR raw data;
removing said phase difference from said preliminary image data; and
implementing an inverse transformation of said preliminary image data, from which said phase difference was removed, in the raw data space, so as to produce phase-corrected raw data in the raw data domain.

10. The method as claimed in claim 1, comprising:
executing a geometric distortion correction of at least one of the diffusion-weighted recordings of MR raw data or the reconstructed diffusion-weighted MR image data.

11. A magnetic resonance (MR) apparatus, comprising:
an MR data acquisition scanner; and
one or more processors configured to operate said MR data acquisition scanner so as to acquire at least two diffusion-weighted recordings of MR raw data that are weighted with a b-value, and entering the acquired diffusion-weighted recordings of MR raw data at respective data points of a raw data space that is stored in a raw data memory, said raw data space being divided into a first subregion and a second subregion, the first subregion including more than half of the raw data points in said raw data space,
wherein entering the acquired diffusion-weighted recordings of the MR raw data at respective data points of the raw data space comprises:
fully sampling the MR raw data by sampling the MR raw data at each of the raw data points in said first subregion for each of said at least two diffusion-weighted recordings, respectively; and
undersampling the MR raw data by sampling the MR raw data at less than each of the raw data points in said second subregion for each of said at least two diffusion-weighted recordings, respectively, the undersampling being performed for the second subregion of one of the said at least two diffusion-weighted recordings using a different scan pattern than the undersampling of the second subregion of the other one of said at least two diffusion-weighted recordings; and
combining and reconstructing the fully sampled MR raw data and the undersampled MR raw data of the at least two diffusion-weighted recordings weighted with said b-value from the diffusion-weighted MR raw data entered in said first and second subregions of said raw data memory to generate diffusion-weighted MR image data that is weighted with said b-value.

12. A non-transitory, computer-readable data storage medium encoded with programming instructions, said storage medium being loaded into a computer of a magnetic resonance (MR) apparatus that comprises an MR data acquisition scanner, said programming instructions causing said MR apparatus to:
operate said MR data acquisition scanner to acquire at least two diffusion-weighted recordings of MR raw data that are weighted with a b-value, and entering the acquired diffusion-weighted recordings of MR raw data at respective data points of a raw data space that is stored in a raw data memory, said raw data space being divided into a first subregion and a second subregion, the first subregion including more than half of the raw data points in said raw data space,
wherein entering the acquired diffusion-weighted recordings of the MR raw data at respective data points of the raw data space comprises:
fully sampling the MR raw data by sampling the MR raw data at each of the raw data points in said first subregion for each of said at least two diffusion-weighted recordings, respectively; and
undersampling the MR raw data by sampling the MR raw data at less than each of the raw data points in said second subregion for each of said at least two diffusion-weighted recordings, respectively, the undersampling being performed for the second subregion of one of the said at least two diffusion-weighted recordings using a different scan pattern than the undersampling of the second subregion of the other one of said at least two diffusion-weighted recordings; and
combining and reconstructing the fully sampled MR raw data and the undersampled MR raw data of the at least two diffusion-weighted recordings weighted with said b-value from the diffusion-weighted MR raw data entered in said first and second subregions of said raw data memory to generate diffusion-weighted MR image data that is weighted with said b-value.

* * * * *